United States Patent [19]
Lee

[11] Patent Number: 5,412,606
[45] Date of Patent: May 2, 1995

[54] MEMORY PRECHARGE TECHNIQUE

[75] Inventor: Kang W. Lee, Allentown, Pa.

[73] Assignee: AT&T Corp., Murray Hill, N.J.

[21] Appl. No.: 219,059

[22] Filed: Mar. 29, 1994

[51] Int. Cl.6 .................................. G11C 7/00
[52] U.S. Cl. .................... 365/203; 365/190; 365/204
[58] Field of Search ............... 365/203, 209, 190, 202

[56] References Cited

U.S. PATENT DOCUMENTS

| | | | |
|---|---|---|---|
| 3,848,236 | 11/1974 | Troutman | 365/204 |
| 4,679,172 | 7/1987 | Kirsch et al. | 365/205 X |
| 4,903,238 | 2/1990 | Miyatake et al. | 365/203 X |
| 4,905,197 | 2/1990 | Urai | 365/204 |
| 4,914,633 | 4/1990 | Rose et al. | 365/203 |

Primary Examiner—Joseph A. Popek
Assistant Examiner—Son Dinh
Attorney, Agent, or Firm—James H. Fox

[57] ABSTRACT

An integrated circuit memory array includes column conductors that are precharged during a precharge period in order to reduce the effects of power supply voltage variations, a load resistor is connected between the column conductors and ground during a portion of the precharge period. In this manner, a voltage-divider is formed that provides a discharge path which prevents over-charging of the column conductors. An increase in power supply noise immunity is gained, thereby avoiding degradation of the worst-case memory access time that could otherwise occurs.

21 Claims, 4 Drawing Sheets

MEMORY PRECHARGE TECHNIQUE

BACKGROUND OF THE INVENTION

1. Field of the Invention

The present invention relates to an integrated circuit that includes an array of memory cells.

2. Description of the Prior Art

Integrated circuits that include memories typically comprise an array of memory cells arranged in rows and columns. For example, an illustrative memory design 100 is shown in FIG. 1. The memory cells 107–109 may be of the static type, for example, in which case each cell typically comprises four cross-coupled transistors, or alternatively two cross-couple transistors each having load resistors. The access transistors 110–115 conduct, thereby provide access to the memory cells in the illustrated row, when the row conductor 117 is activated. That is, when the access transistors are n-channel devices, a high row conductor voltage allows access to the memory cells from the corresponding column conductors 118–123. The column conductors are alternatively referred to as "bit lines" in the art, since a single bit of information is read from a given memory cell, or written into a given memory cell, in a given selected column. The row selection circuitry, column selection circuit, and sense amplifiers that increase the signal level from the memory cells are well known in the art, and not shown in FIG. 1. It will also be understood by persons of skill in the art that static memories are bistable devices having two nodes that are stable in opposite voltage levels, and access to both nodes is typically desired. However, dynamic memory cells used in dynamic random access memory (DRAM), and read only memory (ROM) cells are usually of a single-ended design, requiring only a single access transistor and a single column conductor per column of memory cells.

During each memory cycle, and prior to a given access operation, the column conductors are precharged to a high voltage level. That is, when the voltage on the precharge line 116 goes high, the precharge transistors 101–106 momentarily conduct, thereby pulling the voltage on the column conductors toward the positive power supply voltage $V_{DD}$. However, in the illustrated case, the threshold voltage drop across the n-channel precharge transistors ($V_{tn}$) causes the column conductors to be precharged to only a threshold voltage below the power supply voltage (i.e., to $V_{DD} - V_{tn}$). This lowered precharge voltage is desirable in many cases, since it allows a faster read or write operation to the selected cells. For example, during a write operation, the lowered precharge voltage allows the write circuitry to drive the column conductors in the selected column toward opposite voltage levels (i.e., one toward $V_{DD}$ and the other toward $V_{SS}$) at a faster rate than if they were precharged to the full $V_{DD}$ level. The lowered precharge voltage is especially significant during a read operation, when the relatively small current sinking capability of the selected memory cell must drive the zero-going column conductor rapidly toward $V_{SS}$ (zero volts). This is required so that the sense amplifier can detect the proper memory state (logic "1" or "0") stored in the selected cell within the prescribed access time, which is desirably as short as possible.

One condition that may occur during a precharge operation, and which is especially disruptive during a subsequent read operation, concerns noise on the positive power supply voltage $V_{DD}$. That is, any positive noise voltages tend to increase the precharge voltage above the nominal design value. Such noise may be due to ground bounce on the negative power supply conductor, or changes in the power supply load due switching transients as output buffers switch, or various inductive and/or capacitive coupling effects, etc. However, whatever the cause, an increase in the precharge voltage is undesirable, since it increases the access time, especially during a read operation. This is because the memory cell must take a longer time to drive the zero-going column conductor sufficiently toward ground that the sense amplifier can detect the proper stored signal level. Therefore, the designer of the integrated circuit must allow sufficient time during a worst-case read operation to compensate for the longer access time in the case of maximum anticipated noise. A similar noise effect occurs during a write operation, but the larger current-drive capability of the write circuitry (not shown in FIG. 1) makes the penalty less severe.

Note that some prior-art designs provide for precharging the column conductors to the full $V_{DD}$ level. This is typically accomplished using p-channel precharge transistors activated by a low-going gate voltage, in lieu of the n-channel precharge transistors shown in FIG. 1. The above noise considerations still apply, except that the drain-to-substrate p-n junctions of the p-channel precharge transistors may limit the maximum noise voltage to one diode voltage drop (about 0.6 volts) above $V_{DD}$.

In the prior art, one technique to alleviate the power supply noise problem is to add devices that provide a high-resistive leakage path to ground ($V_{SS}$). For example, resistors 124–129 may be provided, which allow any noise-induced positive voltage spike to slowly decay. However, this technique dose not help for fast noise. This is because the resistors must be made sufficiently large, each having a value typically in the range of hundreds of megohms to several gigaohms, that the readout signal from the memory cells is not impaired due to excessive loading. Otherwise, the drive capability of the memory cells would have to be increased. This is undesirable, considering that the most power dissipation of typical memory devices is contributed by the memory array. Furthermore, the increase drive capability would undesirably add to the size of the transistors in the memory cells, and hence to the size of the array. Therefore, an improved technique that provides for increased power supply noise immunity, while avoiding excessive loading effects, is desirable.

SUMMARY OF THE INVENTION

I have invented an improved integrated circuit memory cell precharge technique. During a portion of the memory cycle, a resistive load is placed on the column conductors.

DETAILED DESCRIPTION

Figure 1:
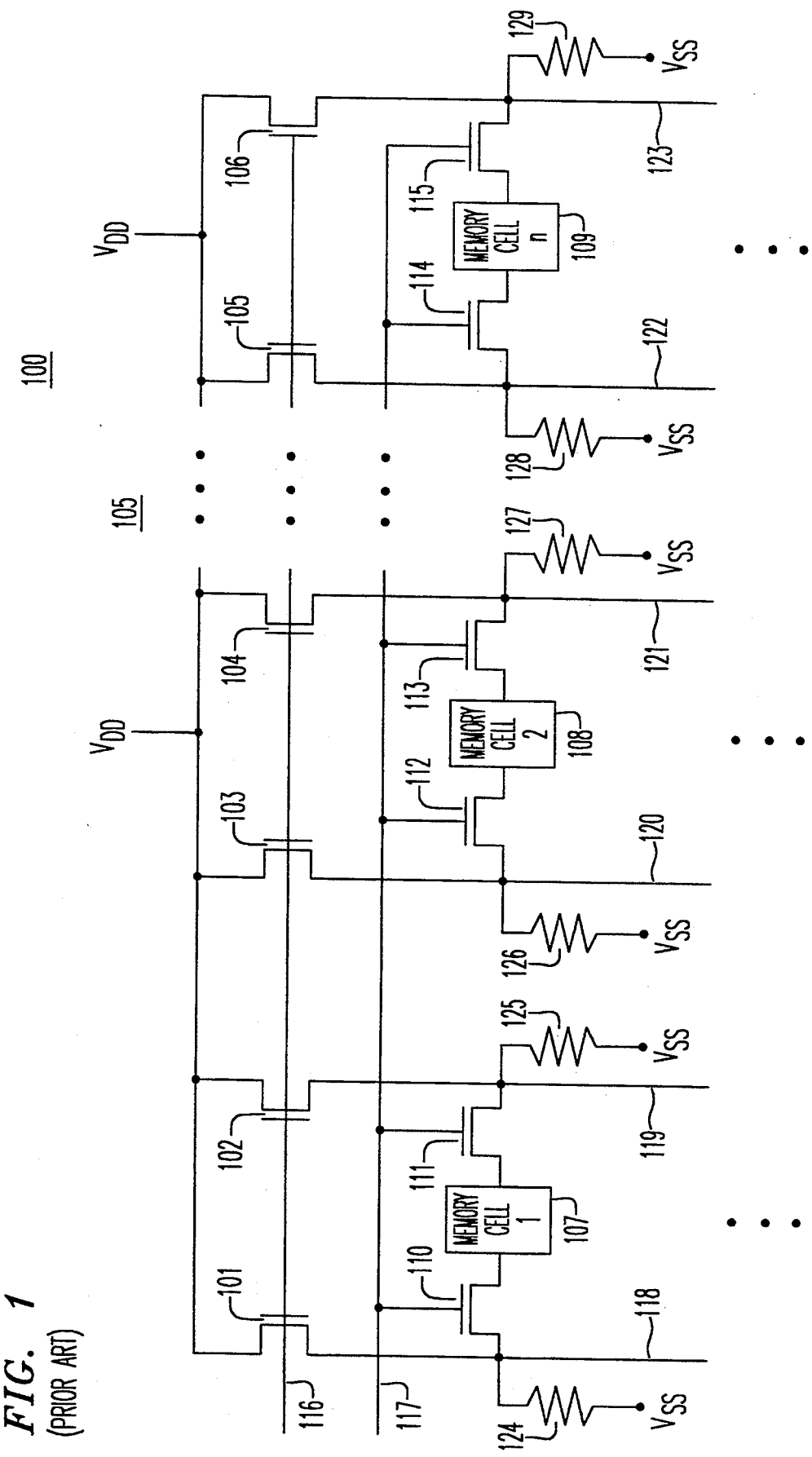
FIG. 1 shows a typical prior-art memory array.
Figure 2:
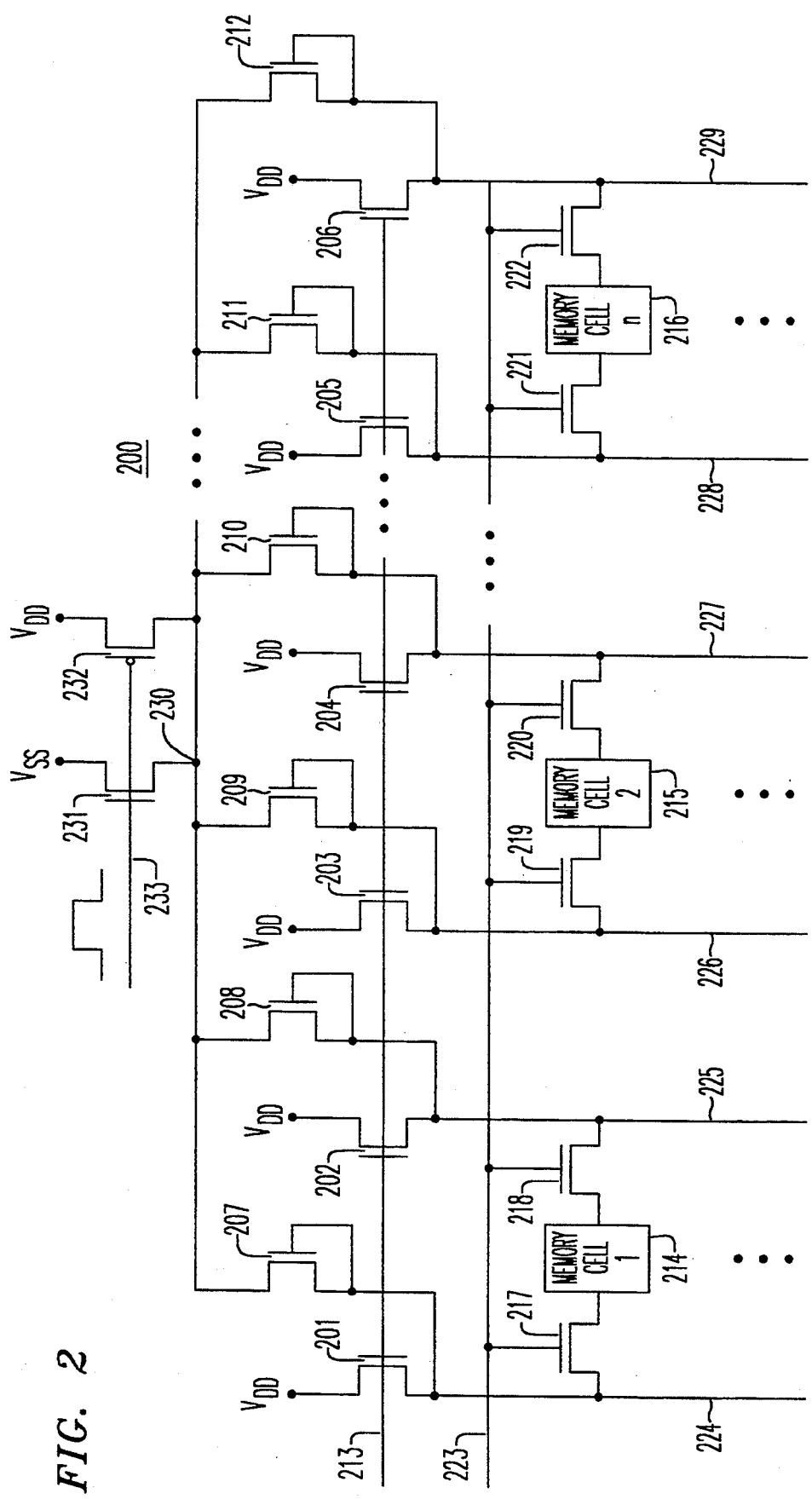
FIG. 2 shows a first memory array that embodies the inventive technique.

The following detailed description relates to an integrated circuit memory array that implements an improved precharge technique. Referring to FIG. 2, a illustrative memory array 200 comprises memory cells 214–216 that are accessed via access transistors 217–222. The word line 223 is activated by a positive voltage pulse in the case of n-channel access transistors so as to allow access to the memory cells for a read or a write operation. The desired information is read into, or out of, the memory cells via column conductors 224–229. The column conductors are precharged to a high voltage state by precharge transistors 201–206, which are activated by a positive voltage pulse on precharge control line 213. As thus described, the memory array is of a conventional type described above.

The inventive technique provides for a load to be applied to the column conductors 224–229 during the precharge operation. This allows the voltage on the column conductors to stabilize before an access operation. For example, in the illustrative case of FIG. 2, load transistors 207–212 are each connected with their drain connected to their gate. This causes each load transistor to act as a resistor in series with a diode. The diode allows current to flow from the precharged column conductors to ground ($V_{SS}$), but prevents charging of one column conductor from another connected to the common node 230. The load transistors are each connected between a corresponding column conductor and discharge control transistor 231 via common node 230. The discharge control transistor 231 is caused to periodically conduct by means of positive discharge pulses on discharge control line 233, thereby causing node 230 to be periodically coupled to the ground (zero-volt) power supply conductor $V_{SS}$. In this manner, the load transistors are periodically connected between the column conductors and $V_{SS}$. The size of each load transistor is relatively small, in order to provide a relatively high resistance. I recommend a resistance value in the range of 1 to 100 kilohms, and typically about 10 to 20 kilohms in present-day designs. The discharge control transistor 231 is relatively large, to provide sufficient conductivity for maintaining node 230 at a low voltage stage during conduction of transistor 231. Note that the voltage at node 230 during conduction of transistor 213 will be approximately $V_{SS}$ in the illustrative case of an n-channel discharge control transistor. At the times when the discharge control line is low, the p-channel transistor 232 maintains the common node 230 high, at approximately $V_{DD}$. This prevents the column conductors from discharging through the common node at times other than the discharge period.

Figure 4:
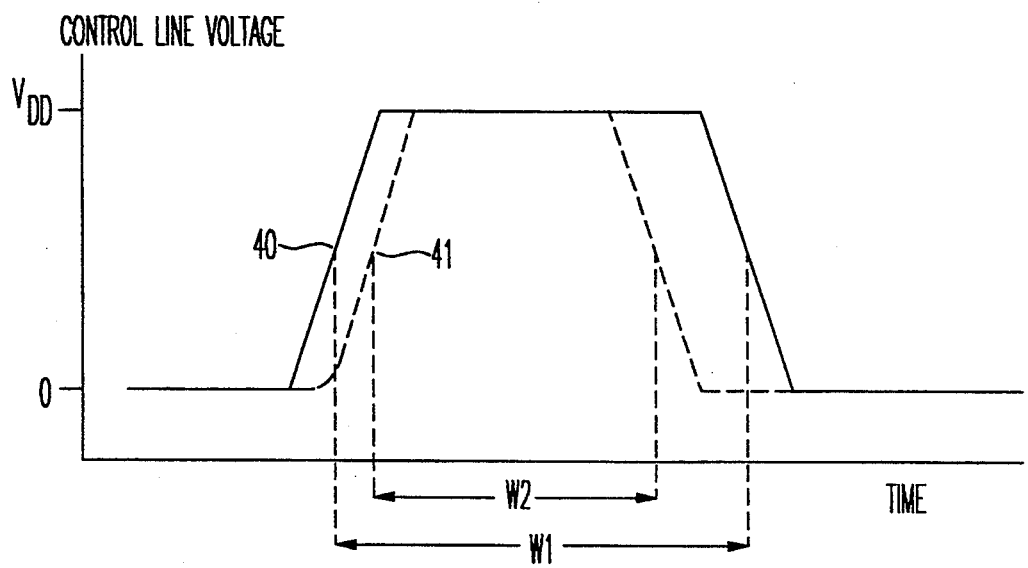
FIG. 4 shows typical precharge and discharge pulses.

During the precharge period, the noise-induced charges on the column conductors are at least partially discharged through the load transistors 207–212 and the discharge control transistor 231. This occurs because when transistor 231 conducts, the precharge transistor, the load transistor, and the discharge control transistor act like a voltage divider connected to the respective column conductor. The sizes of these transistors may be optimized to maintain the voltage on each column conductor at approximately $V_{DD}-V_{tn}$. Referring to FIG. 4, a timing diagram shows an illustrative case wherein the waveforms of the precharge pulse (40) on precharge control line 213 and the discharge pulse (41) on the discharge control line 233 are superimposed. Note that the pulse width ($W_1$) of the precharge pulse 40 may be chosen according to conventional memory design criteria. This precharge pulse is periodic, occurring at the beginning of a given memory cycle. The pulse width ($W_2$) of the discharge pulse 41 is less than the precharge pulse. Furthermore, as indicated, the discharge pulse typically occurs within the same time period as the precharge pulse. That is, the waveform 41 begins to rise shortly after waveform 40 begins to rise, and the waveform 41 begins to fails before waveform 40 begins to fall. In a typical case, the precharge pulse 40 has a duration ($W_1$) of about ½ of a memory cycle, and the discharge pulse 41 has a duration ($W_2$) of about 70 to 95 percent as long as that of the precharge pulse.

Figure 5:
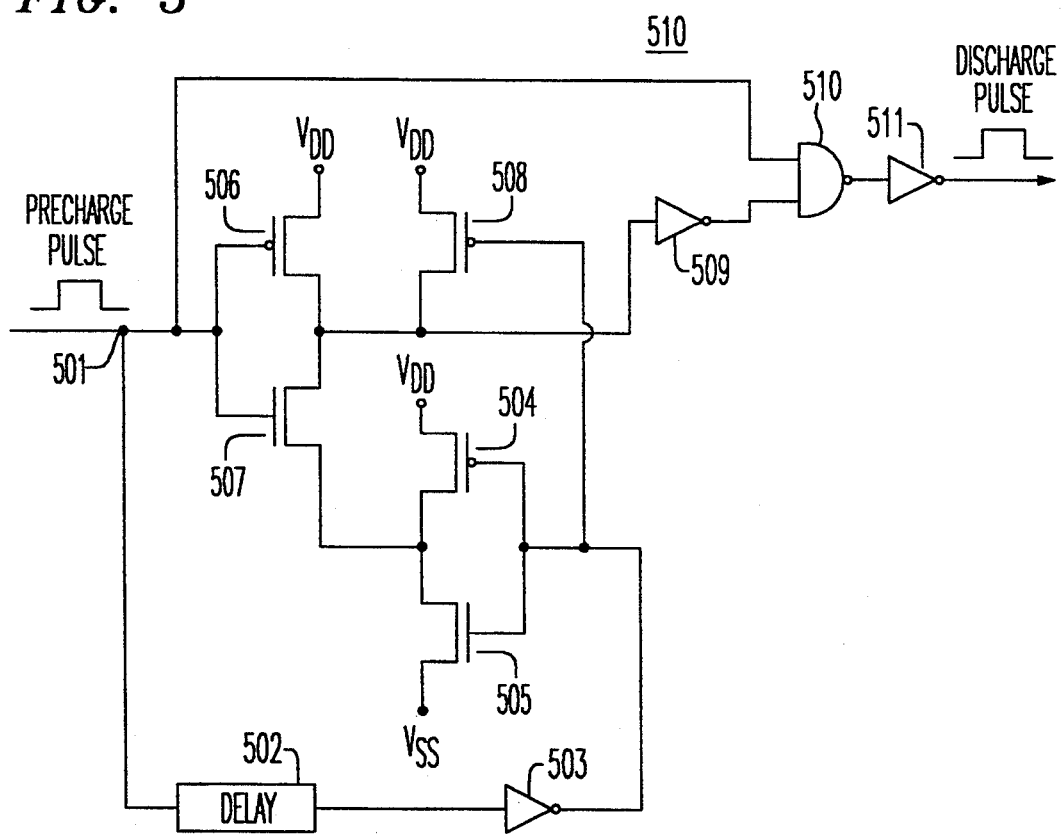
FIG. 5 shows an embodiment of a circuit for generating the discharge pulse from the precharge pulse.

An illustrative circuit that is suitable for generating the discharge pulse is shown in FIG. 5, with other techniques being possible. The circuit of FIG. 5 produces the discharge pulse at the output of inverter 511, and generates it from the precharge pulse that is applied to the input at node 501. In this manner, the discharge pulse is ensured to lie within the precharge pulse, and may obtain the desired pulse width, as follows:

(1) The positive-going precharge pulse at node 501 is applied to one input of NAND gate 510, and simultaneously to the input of the inverter comprising complementary transistor pair 506 and 507. The causes the output of inverter 506–507 to go low, which causes the output of inverter 509 to go high. Therefore, both inputs of NAND gate 510 are then high after a short delay through inverters 506–507 and 509, thereby causing the output of NAND gate 510 to go low, and hence causing the output of inverter 511 to go high. This is represented by the rising edge of waveform 41 in FIG. 4.

(2) The delay circuit 502 delays the positive-going transition at node 501 for a desired delay period, being approximately equal to $W_2$. During this delay period, the input of inverter 503 is low, and hence the output of inverter 503 is high, causing transistor 508 to be non-conducting; furthermore, it causes the output of inverter pair 504–505 to be low, which allows the output of inverter 506–507 to be pulled low, as noted in (1) above. Therefore, the inverter 509 causes one input of NAND gate 510 to remain high for the delay period, which causes the output of 510 to remain low. Hence, the output of inverter 511 is maintained in a high voltage state for the duration of the delay period.

(3) After the delay period, the output of 502 goes high, causing the output of inverter 503 to go low. This prevents transistor 505 from conducting, while causing transistor 508 to conduct, thereby pulling the input of inverter 509 high. Therefore, a low output of inverter 509 appears at an input of NAND gate 510, causing the output of 510 to go high. This produces a high input at inverter 511, causing the output of inverter 511 to go low, thereby terminating the discharge pulse. This is represented by the falling edge of waveform 41 in FIG. 4.

While the above technique for deriving the discharge pulse from the precharge pulse is advantageous and convenient, these pulses may be generated independently if desired. Furthermore, a variety of circuit technique may be employed. The width of the discharge pulse ($W_2$) is desirably chosen to be sufficiently long to obtain the desired noise voltage control, but not overly long so as to excessively discharge the column conductors. While a single precharge pulse, and corresponding discharge pulse is illustrated herein, it will be understood by persons of skill in the art that these pulses are periodic, appearing during each memory cycle.

Figure 3:
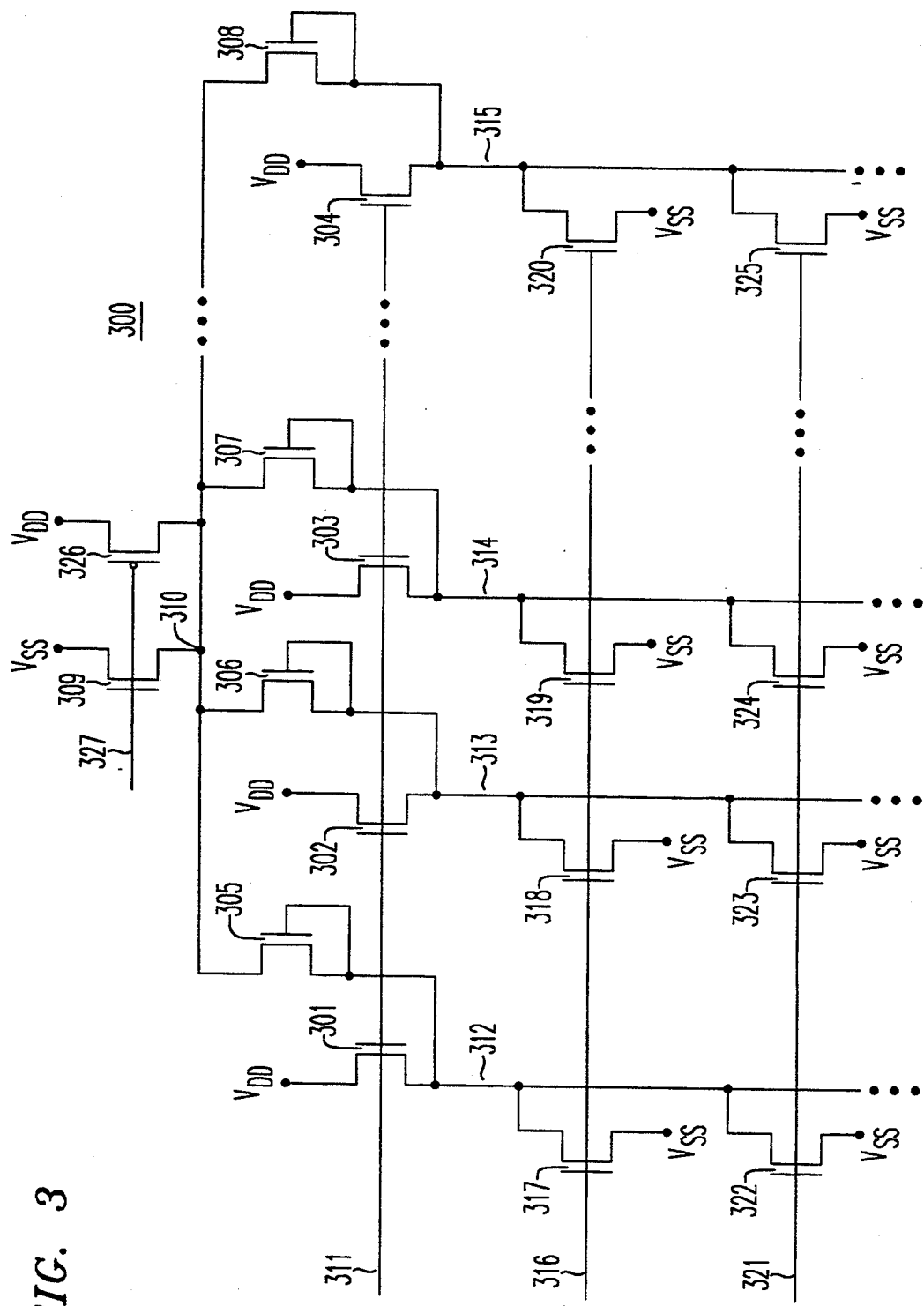
FIG. 3 shows a second memory array that embodies the inventive technique.

The present precharge control technique may be used in a variety of memory applications. For example, two column conductors per column is illustrated in the static memory embodiment of FIG. 2. However, the use of a single column conductor per column is used in a variety of memory array designs, including dynamic random access memories (DRAMs) and read only memories (ROMs). A typical ROM array 300 is shown in FIG. 3. The precharge transistors 301–304 are controlled by precharge control line 311, and the load transistors 305–308 are connected between the column conductors 312–315 and the common node 310. The common node 310 is alternatively pulled toward $V_{SS}$ and $V_{DD}$ by means of control transistors 309 and 326, which are controlled by the discharge pulse on discharge control line 327 as above. The memory cells comprise transistors 317–320, accessed via word line 316, and transistors 322–325, accessed via word line 321. Each transistor is rendered conducting, or alternatively non-conducting, in order to represent a stored "1" or "0" logic state, according to techniques known in the art.

Note that while a single discharge control transistor (231,309) connected to a given common node (230, 310) is shown in the above arrays, a large array may comprise two or more sub-arrays, each being separately controlled. The common node pull-up p-channel transistor (232, 326) may alternatively be replaced by a pull-up resistor or other device. Note also that the precharge voltage is considered to be a "high" voltage herein, and the discharge voltage a "low" voltage. These correspond to more positive, and less positive, voltages respectively in the case of conventional IC operating potentials, wherein typically $V_{SS}=0$ volts, and $V_{DD}=5$ volts (or alternatively 3 volts, or even less). However, the term "high" may apply to more negative voltages in case the IC array operates from a negative-polarity power supply, for example. While field effect transistors are shown in the above embodiments, the use of bipolar transistors for some or all of the load, control, and memory devices is possible, and included herein, with still other variations being possible.

I claim:

1. An integrated circuit comprising a memory array having memory cells arranged in rows and columns, with the memory cells in each column being accessed by one or more column conductors; and
    wherein said column conductors are precharged to a first voltage level during a precharge period prior to the memory access portion of a memory cycle;
    Characterized in that said integrated circuit further comprises load resistors that are connected between said column conductors and a source of a second voltage level that is lower than said first voltage level during a discharge period
    wherein said discharge period occurs entirely within said precharge period;
    and wherein said load resistors are not connected between said column conductors and said source of a second voltage level during at least a portion of said memory cycle.

2. The integrated circuit of claim 1 wherein the duration of said discharge period is in the range of from 0.7 to 0.95 times as long as the duration of said precharge period.

3. The integrated circuit of claim 1 wherein said load resistors are field effect transistors.

4. The integrated circuit of claim 3 wherein said field effect transistors each have their gate connected to their drain.

5. The integrated circuit of claim 4 wherein said field effect transistor have their sources connected to a common node, and with a control transistor being connected between said common node and said source of a second voltage level.

6. The integrated circuit of claim 1 wherein said load resistors each have a resistance in the range of from 1 to 100 kilohms.

7. An integrated circuit comprising a memory array having memory cells arranged in rows and columns, with the memory cells in each column being accessed by one or more column conductors; and
    wherein said column conductors are precharged to a positive voltage level by means of precharge transistors controlled by a precharge pulse so as to conduct during a precharge period prior to the memory access portion of a memory cycle;
    Characterized in that said integrated circuit further comprises n-channel field effect load transistors connected between said column conductors and a common node, wherein said field effect load transistors have their drains and gates connected to the respective column conductors, and have their sources connected to said common node;
    and still further comprises an n-channel field effect control transistor connected between said common node and a source of power supply ground potential;
    and still further comprises a pulse generator that provides a discharge pulse for causing said control transistor to conduct during a portion of said precharge period, and to not conduct at times other than said portion.

8. The integrated circuit of claim 7 still further comprising a pull-up device connected between said common node and a positive voltage source.

9. The integrated circuit of claim 8 wherein said pull-up device is a p-channel field effect transistor controlled by said discharge pulse.

10. The integrated circuit of claim 7 wherein said pulse generator has an input that receives said precharge pulse, and has an output that provides said discharge pulse, and further has a delay circuit that provides a time delay that approximates said portion of said precharge period.

11. An integrated circuit comprising a memory array having memory cells arranged in rows and columns, with the memory cells in each column being accessed by one or more column conductors; and
    wherein said column conductors are precharged to a first voltage level during a precharge period prior to the memory access portion of a memory cycle;
    Characterized in that said integrated circuit further comprises load resistors that are coupled between each of said column conductors and a common node, and with a control transistor being coupled between said common node and a source of a second voltage level that is lower than said first voltage level;
    whereby said column conductors are pulled to said second voltage level during a discharge period, and are not pulled to said second voltage level during at least a portion of said memory cycle.

12. The integrated circuit of claim 11 wherein said discharge period occurs entirely within said precharge period.

13. The integrated circuit of claim 12 wherein the duration of said discharge period is in the range of from 0.7 to 0.95 times as long as the duration of said precharge period.

14. The integrated circuit of claim 11 wherein said load resistors are field effect transistors.

15. The integrated circuit of claim 14 wherein said field effect transistors each have their gate connected to their drain, and have their sources connected to said common node.

16. The integrated circuit of claim 11 wherein said load resistors each have a resistance in the range of from 1 to 100 kilohms.

17. An integrated circuit comprising a memory array having memory cells arranged in rows and columns, with the memory cells in each column being accessed by one or more column conductors; and wherein said column conductors are precharged to a first voltage level during a precharge period prior to the memory access portion of a memory cycle;

Characterized in that said integrated circuit further comprises field effect transistors that are coupled between each of said column conductors and a common node, with said field effect transistors each having their gate connected to their drain;

and with a control transistor being coupled between said common node and a source of a second voltage level that is lower than said first voltage level;

whereby said column conductors are pulled to said second voltage level during a discharge period, and are not pulled to said second voltage level during at least a portion of said memory cycle.

18. The integrated circuit of claim 17 wherein said discharge period occurs entirely within said precharge period.

19. The integrated circuit of claim 18 wherein the duration of said discharge period is in the range of from 0.7 to 0.95 times as long as the duration of said precharge period.

20. The integrated circuit of claim 17 wherein said field effect transistors have their sources connected to said common node.

21. The integrated circuit of claim 17 wherein said field effect transistors each have a source-to-drain resistance in the range of from 1 to 100 kilohms.

* * * * *